United States Patent
Chen et al.

(10) Patent No.: US 11,245,394 B2
(45) Date of Patent: Feb. 8, 2022

(54) POWER DEVICE DRIVING DEVICE AND DRIVING METHOD

(71) Applicant: LEN Technology Limited, Wuxi (CN)

(72) Inventors: Jingquan Chen, San Jose, CA (US); Chuan Ni, Plano, TX (US); Wei Lu, Shanghai (CN)

(73) Assignee: LEN Technology Limited, Wuxi (CN)

(*) Notice: Subject to any disclaimer, the term of this patent is extended or adjusted under 35 U.S.C. 154(b) by 44 days.

(21) Appl. No.: 16/920,205

(22) Filed: Jul. 2, 2020

(65) Prior Publication Data
US 2022/0006451 A1  Jan. 6, 2022

(51) Int. Cl.
*H03K 17/567* (2006.01)

(52) U.S. Cl.
CPC ................. *H03K 17/567* (2013.01)

(58) Field of Classification Search
CPC ....... H03K 17/08116; H03K 17/08128; H03K 17/167; H03K 17/567
See application file for complete search history.

(56) References Cited

U.S. PATENT DOCUMENTS 10,790,818 B1 * 9/2020 Frank ............... H03K 17/06
2018/0034459 A1 * 2/2018 Lee ............... H03K 17/08122

\* cited by examiner

*Primary Examiner* — Lincoln D Donovan
*Assistant Examiner* — Colleen J O Toole
(74) *Attorney, Agent, or Firm* — Seed IP Law Group LLP

(57) ABSTRACT

The present application discloses a driving device for a power device, which includes a control circuitry configured to receive at least a system switching command and a feedback signal of a power device, and to generate a pull-up strength control signal or a pull-down strength control signal according to the received signals; and a pull-up array and/or a pull-down array, coupled between the control circuitry and the power device, and configured to provide a corresponding pull-up or pull-down strength for the power device according to the pull-up or pull-down strength control signal. The present application also discloses the corresponding electric appliance and power device driving method.

20 Claims, 9 Drawing Sheets

POWER DEVICE DRIVING DEVICE AND DRIVING METHOD

BACKGROUND

Technical Field

This application belongs to the field of electrical control, and in some embodiments relates to a driving device and a driving method of a power device.

Description of the Related Art

Power devices such as IGBT or SiC-based power devices may be used in different practical applications or at different stages of the same application. It is necessary to operate the power devices in different states. FIG. 1 is a schematic structural diagram of an existing power device driving apparatus. The driving device of the power device generally includes a pull-up and pull-down control circuitry, a pull-up device (such as Q1 in the figure), and a pull-down device (such as Q2 in the figure). The driving device may further be coupled to the pull-up and pull-down control circuitry, and the other end coupled to the power device though a resistor RG. When users need to increase the switching speed of power devices, they can choose to reduce the resistance of RG; or when the user needs to reduce the switching speed of the power device, the resistance of RG can be increased. But for the driving device of this power device, the driving strength of power devices cannot be dynamically adjusted in real time.

BRIEF SUMMARY

The techniques of this disclosure overcome one or more of the issues described above. This disclosure provides a power device driving device. The driving device includes a control circuitry configured to receive at least a system switching command and a feedback signal of a power device, and to generate a pull-up strength control signal or a pull-down strength control signal based on the received signals. The driving device also includes a pull-up array and/or a pull-down array, coupled between the control circuitry and the power device, and configured to provide a corresponding pull-up or pull-down strength for the power device according to the pull-up or pull-down strength control signal.

In some embodiments, the proposed driving device further includes a decoding unit, coupled between the control circuitry and the pull-up and/or pull-down array, configured to generate corresponding pull-up or pull-down control signals according to the pull-up or pull-down strength control signal and the preset corresponding rules; and wherein, the pull-up or pull-down control signals indicate whether one or more elements in the pull-up or pull-down array is actively engaged or not.

In some embodiments, the proposed multi-stage control circuitry includes a pull-up control circuitry and a pull-down control circuitry, wherein the pull-up and pull-down control circuitry both include a comparison unit configured to compare the feedback signal of the power device with one or more pull-up or pull-down thresholds, and to output a corresponding pull-up or pull-down strength control signal according to the comparison result; wherein the number of the pull-up or the pull-down threshold is N, and the number of corresponding types of pull-up or pull-down drive strength control signals is N+1, and N is an integer greater than or equal to 1.

In some embodiments, the proposed pull-up control circuitry further includes a delay unit configured to start a counter when the power device feedback signal reaches a first pull-up threshold, and when the first timer is over, the pull-up control circuitry switches the pull-up strength control signal; wherein, during or at the end of the timer, the feedback signal of the power device reaches a second pull-up threshold, wherein the second pull-up threshold is greater than the first pull-up threshold; and/or the pull-down control circuitry further includes a delay unit configured to, when the power device feedback signal reaches the first pull-down threshold, and when the timer is over, the pull-down control circuitry switches the pull-down strength control signal; during or at the end of the timing, the power device feedback signal reaches the second pull-down threshold in the threshold, wherein the first pull-down threshold is greater than the second pull-down threshold.

In some embodiments, the proposed multi-stage control circuitry is further configured to receive the error signal of the power device, and when the error signal is asserted, the multi-stage control circuitry is configured to output the pull-down strength control signal.

In some embodiments, the proposed error signal includes an overcurrent signal of a power device or an over temperature error signal or other power supply fault signal.

In some embodiments, the proposed power device is an IGBT transistor, and the feedback signal is the voltage between the gate and the emitter of the IGBT transistor.

In some embodiments, the proposed pull-up or pull-down array includes a plurality of array elements connected in parallel, the impedances of the one or more elements constitute an equal difference, an equal ratio, or a power relationship.

In some embodiments, the proposed array element is a transistor, which is coupled to a supply potential and the output terminals of the driving device, the control input terminal is configured to receive a pull-up or pull-down control signal, and the control electrode of the transistor is coupled with its driver.

In some embodiments, the comparing unit performs a comparison operation using a plurality of thresholds, wherein they are of equal difference, equal ratio or power relationship among the multiple thresholds.

This application also proposes an electric device comprising one or more power devices, driving devices coupled to the power devices, a main control circuitry, and an isolation unit coupled between the main control circuitry and the drive device.

In some embodiments, this application proposes a power device driving method, wherein the power device is driven in multiples stages based on the switching command and the feedback signal of the power device.

In some embodiments, the proposed multi-stage driving method of the power device includes receiving the switching command and power device feedback signal; determining whether the system switch command is asserted; and when the switching signal is asserted, comparing the feedback signal with the first pull-up threshold; when the feedback signal is less than the first pull-up threshold, a first pull-up strength control signal is commanded; when the feedback signal is greater than or equal to the first pull-up threshold, a second pull-up strength control signal is commanded.

In some embodiments, the proposed method further includes, when the switch signal is asserted, when the feedback signal is greater than or equal to the second pull-up threshold, a third pull-up strength control signal is commanded, where the second pull-up threshold is greater than the first pull-up threshold; or when the feedback signal is greater than or equal to the first pull-up threshold, a timer starts, and at the end of timer, a third pull-up strength control signal is commanded, wherein the feedback signal reaches the second pull-up threshold during or at the end of the timer.

In some embodiments, the proposed multi-stage driving of the power device includes receiving a system switch command and power device feedback signal; determining whether the system switch signal is asserted; and when the switch signal is de-asserted, comparing the feedback signal with the first pull-down threshold; when the feedback signal is greater than the first pull-down threshold, a first pull-down strength control signal is commanded; when the feedback signal is less than or equal to the first pull-down threshold, a second pull-down control signal is commanded.

In some embodiments, the proposed method further includes when the switching command is de-asserted:

when the feedback signal is less than or equal to the second pull-down threshold, a third pull-down control signal is output, wherein the first pull-down threshold is greater than the second pull-down threshold; or when the feedback signal is less than or equal to the first pull-down threshold, a timer starts, and at the end of timer, the third pull-down strength control is commanded, wherein the feedback signal reaches the second pull-down threshold during or at the end of the timing period.

In some embodiments, in the proposed method, the first, second or third pull-up and pull-down strength control signals provide different pull-up or pull-down drive impedances to drive the power device.

In some embodiments, in the proposed method, the selection of the array element to provide the pull-up or pull-down drive impedance is preset; or the selection of the array element to provide the pull-up or pull-down drive impedance is dynamically chosen based on their operating state.

In some embodiments, the proposed method further includes receiving an error signal about the power device; when the error signal is asserted, and when the power device is in the pull-up transition or in the pulled up state, the power device starts to perform a pull-down operation.

Using the technical solution provided by this application, the power device pull-up and pull-down is divided into multiple stages; according to the different working states of the driven power, devices can dynamically adjust the driving impedance, that is, the driving capacity in real time, which can achieve improved efficiency, reduce EMI, and simplify device protection schemes.

DESCRIPTION OF FIGURES

Embodiments are shown and explained with reference to the drawings. These drawings are used to clarify the basic principles and thus show only the basic aspects for illustration purposes. These drawings are not to scale. In the drawings, the same reference numerals indicate similar characteristics.

DETAILED DESCRIPTION

Figure 1:
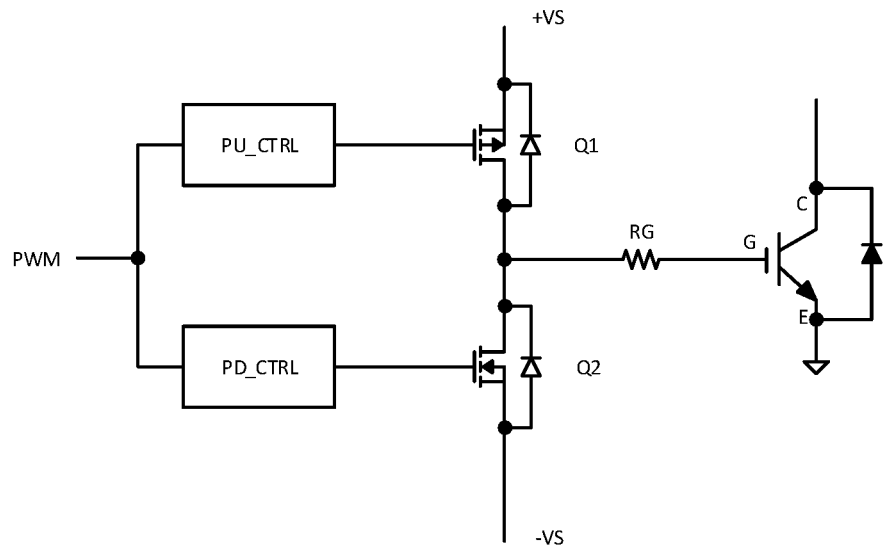
FIG. 1 is a schematic diagram of an existing power device driving apparatus.

In the following detailed description of example embodiments, reference will be made to the accompanying drawings that form a part of the present application. The accompanying drawings show by way of example specific embodiments that can implement the present application. The exemplary embodiments are not intended to exhaust all embodiments according to the present application. It can be understood that, without departing from the scope of the present application, other embodiments may be used, and structural or logical modifications may also be made. Therefore, the following detailed description is not limitative, and the scope of the present application is defined by the appended claims.

Techniques, methods, and devices known to those of ordinary skill in the related art may not be discussed in detail, but where appropriate, the techniques, methods, and devices should be considered as part of the specification. The connection between the units in the drawing is only for convenience of description, which means that at least the units at both ends of the connection are in communication with each other, and is not intended to limit the unconnected units from communicating.

In the following detailed description, reference may be made to the drawings of each specification that are part of this application to illustrate specific embodiments of this application. In the drawings, similar reference numbers describe substantially similar components in different drawings. Each specific embodiment of the present application is described in sufficient detail below so that a person of ordinary skill with relevant knowledge and technology in the art can implement the technical solution of the present application. It should be understood that other embodiments or structural, logical, or electrical changes to the embodiments of the present application may also be used.

Figure 2:
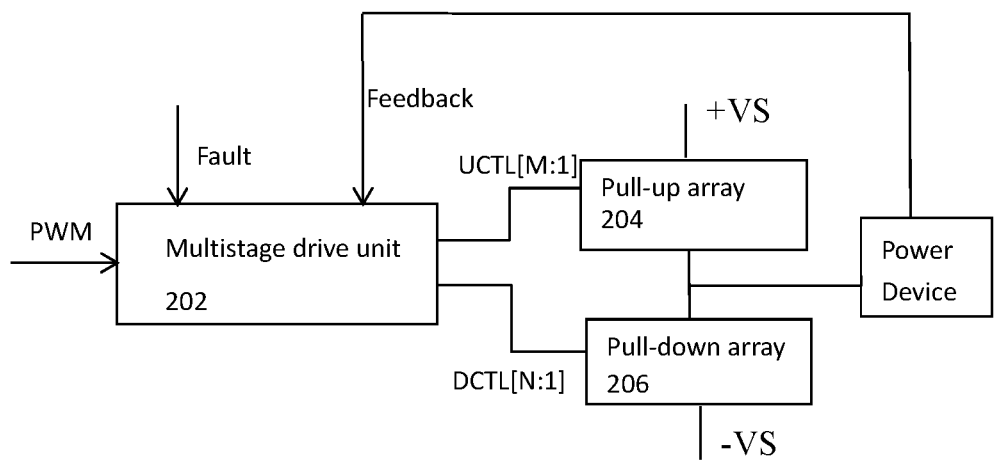
FIG. 2 is a schematic diagram of a driving device architecture according to an embodiment of the present application.
Figure 3A:
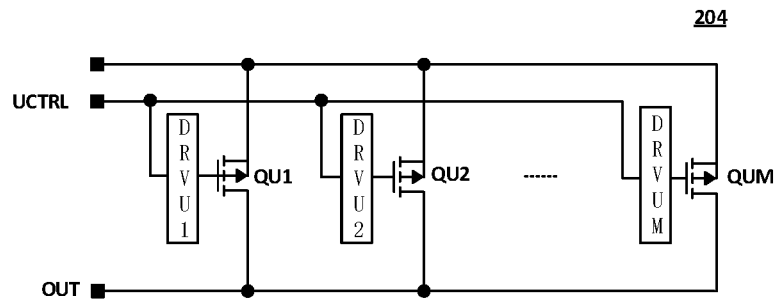
FIGS. 3A and 3B are schematic structural diagrams of a pull-up array and a pull-down array in the architecture shown in FIG. 2.
Figure 3B:
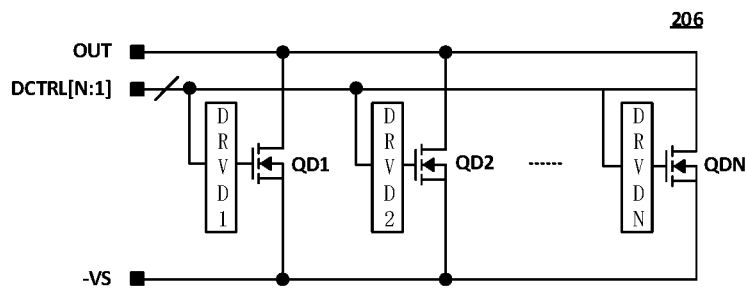
Figure 4:
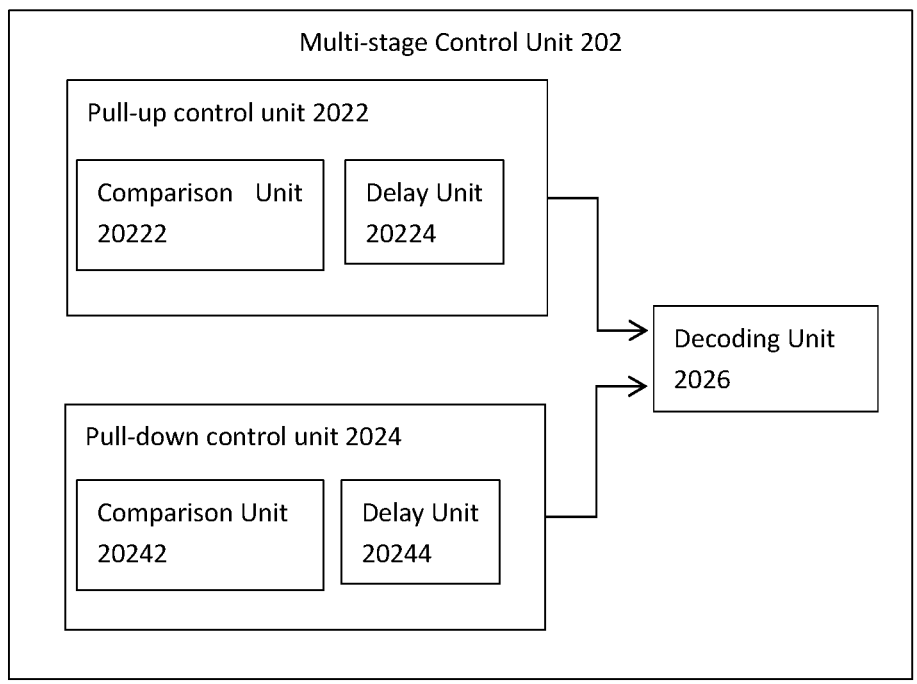
FIG. 4 is a schematic structural diagram of a multi-stage driving unit in the architecture shown in FIG. 2.

The present application proposes a driving device that can realize multi-stage driving. FIG. 2 is a schematic diagram of a driving device architecture according to an embodiment of the present application. FIGS. 3A and 3B are schematic structural diagrams of the driving array in the driving device. FIG. 4 is a schematic structural diagram of a multi-stage control circuitry in the driving device.

As shown in FIG. 2, the driving device may include a multi-stage control circuitry 202 configured to receive the system switching signal PWM, and at the same time may also receive the output of the power device as a feedback input. The multi-state control circuitry 202 may also receive as inputs error signals of one or more detection modules (not shown) positioned inside or outside to the driving device or a monitoring signal other than the feedback signal of the power device itself. These detection signals include, but are not limited to, an overcurrent signal of the power device, a detection signal representing the temperature of the power device, and so on. According to an embodiment, the multi-stage control circuitry 202 may be configured to generate a multi-stage control signal for the power device based on these inputs, that is, to provide different driving strength for the power device according to different situations.

Specifically, the multi-stage control circuitry 202 may be coupled to the pull-up array 204 and the pull-down array 206, respectively, to provide pull-up or pull-down control signals or selection signals to one of the two arrays, thereby selecting different arrays combination to provide desired impedance. In this way, the system switching signal PWM can be provided to the power device using different impedances according to different situations. According to one embodiment, as shown in FIG. 4, the multi-stage control circuitry 202 may include a pull-up control circuitry 2022 and a pull-down control circuitry 2024.

FIGS. 3A and 3B are schematic diagrams of the pull-up array 204 and the pull-down array 206 in the drive device architecture of FIG. 2.

As shown in the figures, the multi-stage control circuitry 202 may provide a pull-up control signal UCTL[M:1] to the pull-up array 204, where M is the number of array elements in the pull-up array, which may be an integer greater than or equal to 1. According to the designation in the UCTL[M:1] signal, those designated array elements in the pull-up array 204, such as transistors, are turned on to form a collective pull-up strength. Of course, the array element can also be a resistor or other device that can be used as an impedance.

Similarly, the multi-stage control circuitry 202 may provide a pull-down control signal DCTL[N: 1] to the pull-down array 206, where N is the number of array elements in the pull-down array, which may be an integer greater than or equal to 1, M and N They can be the same or different. According to the designation of the signal DCTL[N:1], the designated array element in the pull-down array 206, such as a transistor, is turned on to collectively constitute the pull-down impedance.

According to an embodiment, the pull-up array 204 may include M pull-up transistors QU1-QUM, each pull-up transistor is coupled between the power supply terminal+VS and the output terminal OUT, and the control electrode of each transistor may be configured to receive the pull-up control signal UCTRL. Specifically, the pull-up control signal UCTRL can be used to select one or more of the M pull-up transistors, and the selected pull-up transistor is turned on, and then the output terminal OUT outputs the current or the sum of the current flowing through the selected pull-up transistor.

Similarly, the pull-down array 206 may include N pull-down transistors QD1-QDN, each pull-down transistor is coupled between the power supply terminal −VS and the output terminal OUT, and the control electrode of each pull-down transistor is used to receive pull-down control Signal DCTRL. Specifically, the pull-down control signal DCTRL can be used to select one or more of the N pull-down transistors and turn on the selected pull-down transistor, thereby outputting the current flowing through the selected pull-down transistor at the output terminal OUT Or the sum of currents.

Therefore, when it is necessary to adjust the driving strength of the pull-up or pull-down of the driving device, the number of transistors turned on in the pull-up array 204 or the pull-down array 206 can be adjusted respectively. It can be understood that the number of transistors in the pull-up array 204 or the pull-down array 206 and the driving strength (impedance) of each transistor can be adjusted according to specific application needs, that is, each transistor can be a multiple of unit impedance. For example, the pull-up array and pull-down array each may include four transistors with an impedance ratio of 1:2:4:8, or the pull-up array and pull-down array each may also include 15 transistors with the same impedance. The maximum driving capacity and adjustment accuracy of the two configurations are the same. According to different embodiments, the impedance ratio between the elements in an array may be equal difference, equal ratio, or power relationship.

According to one embodiment, the pull-down array 206 may include one or more array elements, such as transistors, for implementing soft power-off of the power device, and the impedance of these transistors may be the largest or relatively large one in the array. Because the impedance is large, the pull-down strength is small, so the soft turn-off should select the one with a large impedance.

In another embodiment, the pull-down array 206 may further include one or more array elements for implementing pull-down clamping such as transistors, and the impedance of these clamped transistors may be one or more of the smallest or relatively small ones of the transistors in the pull-down one or more array elements. Because the impedance is small and the pull-down strength is large, the clamp should be selected to have a strong pull-down strength and a small impedance.

According to an embodiment, each array element, such as the gate of a transistor, can be coupled with a corresponding drive module, such as DRVU1-DRVUM, or DRVD1-DRVN, as shown in FIGS. 3A and 3B. These drive modules can be configured to control the conduction of the corresponding transistors. Since the impedances of the transistors in the array are different, the driving strength of the corresponding driving modules are also correspondingly different. For example, the driving strength of the driving unit that drives the transistor with a small impedance will be stronger. As described above, the impedances of different transistors may have an equal difference, equal ratio, or power relationship, and then the corresponding driving strength of their driving modules may also have an equal difference, equal ratio, or power relationship.

FIG. 4 specifically introduces the internal structure of the multi-stage drive unit 202. According to an embodiment, the pull-up control circuitry 2022 may include a comparison module 20222, which may output a corresponding pull-up strength control signal according to the relationship between the VGE of a power device such as an IGBT and a predetermined pull-up threshold voltage. According to another embodiment, the pull-up control circuitry 2022 may further include a delay module 20224, which may start counting when VGE reaches a predetermined pull-up threshold, and may cause the pull-up control circuitry 2022 to switch to the desired pull-up strength at the end of the timing control signal. The reason why the pull-up control circuitry 2022 can determine the switching of the pull-up strength control signal by setting the delay module 20224 is because VGE rises relatively fast, if you set up multiple pull-up thresholds to further increase the number of stages, it may not be easy to accurately determine the relationship between VGE and the threshold, or the difference between multiple thresholds is not large, so it may result in the failure to switch the impedance of the multi-stage control in time. In view of this, the user can determine a set time based on the empirical value.

Of course, using multiple pull-up thresholds for multi-stage drive is also within the scope of this application. For example, in the case of stages using N thresholds, there will be N+1 level pull-up or pull-down strength control signals, where N is an integer greater than or equal to 1.

According to one embodiment, the pull-down control circuitry 2024 may include a comparison module that can output a corresponding pull-down strength control signal according to the relationship between the VGE of a power device such as an IGBT and a predetermined threshold voltage. For example, the first pull-down threshold voltage is used to determine the time to start weakening the pull-down strength, and the second pull-down threshold voltage is used to determine the time to start the pull-down clamping, wherein the first pull-down threshold voltage is greater than the second pull-down threshold voltage. In this way, the gap between the thresholds in the pull-down multi-stage drive can be set relatively large, so that the detection of whether the VGE reaches these thresholds will be easier to judge. Therefore, it is not necessary to use a delay module to assist the switching of the multi-stage drive. Of course, the pull-down control circuitry 2024 can also include a delay module 20244, so that the pull-down control circuitry 2024 can also use a pull-down threshold in conjunction with the above-mentioned pull-up control circuitry 2022 in combination with a preset delay to form a three-stage pull-down process.

According to one embodiment, there may be multiple pull-up and pull-down strength control signals, and the array may determine which array units are used to form the corresponding drive impedance based on these signals, and of course, it may also be set in the multi-stage drive unit 202. A decoding unit 2026 is configured to receive these pull-up or pull-down strength signals, and generates corresponding pull-up or pull-down control signals according to preset rules. Of course, only one effective pull-up or pull-down strength control signal is provided to the decoding unit 2026 at a time.

Figure 5A:
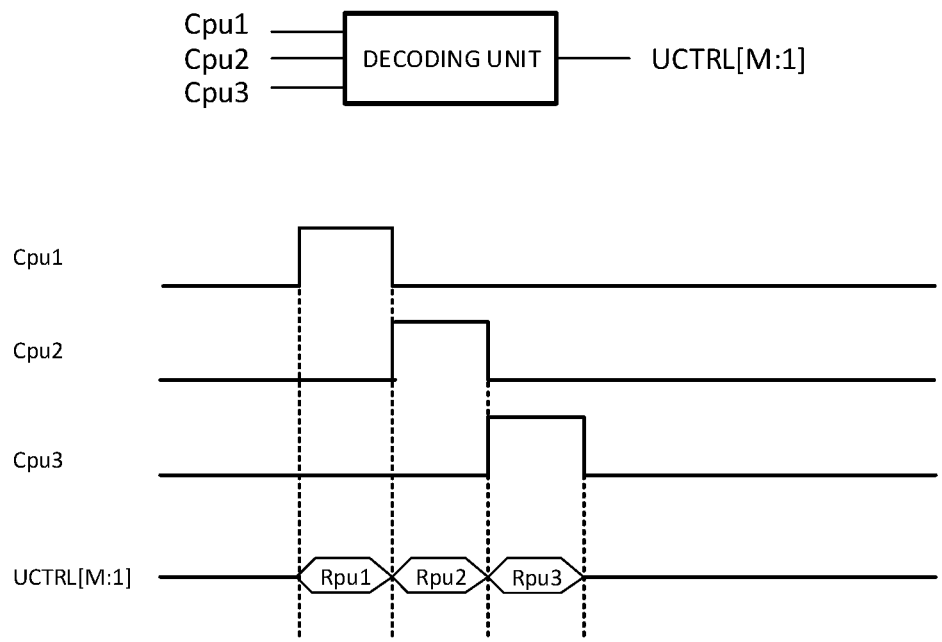
FIGS. 5A and 5B are schematic diagrams of the correspondence between the pull-up and pull-down strength control signals and the drive impedance.
Figure 5B:
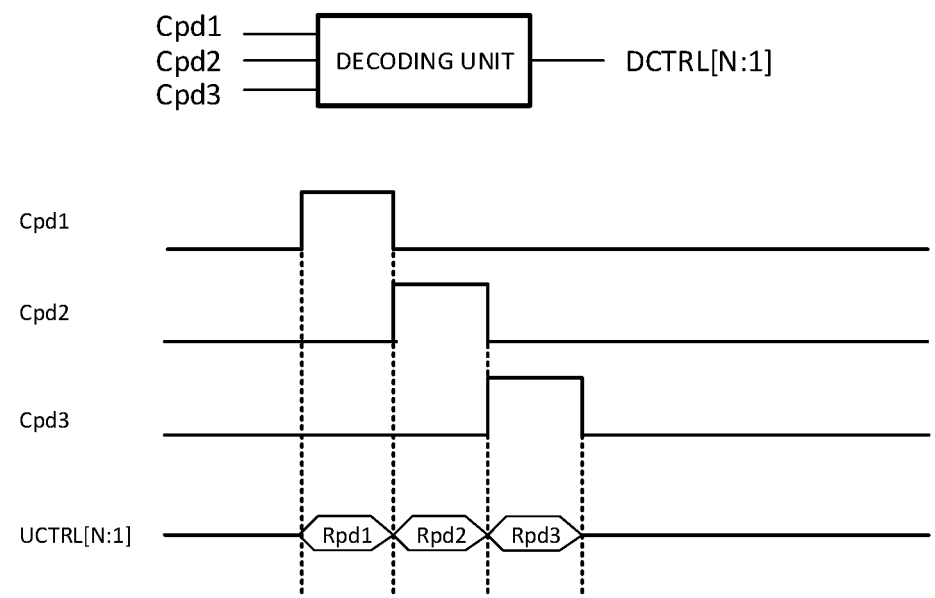

FIGS. 5A and 5B show a schematic diagram of the relationship between the pull-up and pull-down strength control signals and corresponding impedances according to an embodiment of the present application. As shown in FIG. 5A, where Cpu1, Cpu2, and Cpu3 are three-stage pull-up strength control signals, the decoding logic receives these drive strength control signals and generates a pull-up drive signal UCTRL that can control the pull-up array. Cpu1, Cpu2, and Cpu3, respectively, correspond to three impedances Rpu1, Rpu2, and Rpu3 whose drive array impedances are different from each other.

Similarly, FIG. 5B shows that the Cpd1, Cpd2, and Cpd3 pull-down driving strength control signals are decoded and decoded to obtain the pull-down driving signal DCTRL. Of course, there are more pull-up or pull-down drive strength control signals to choose from as needed.

Figure 6:
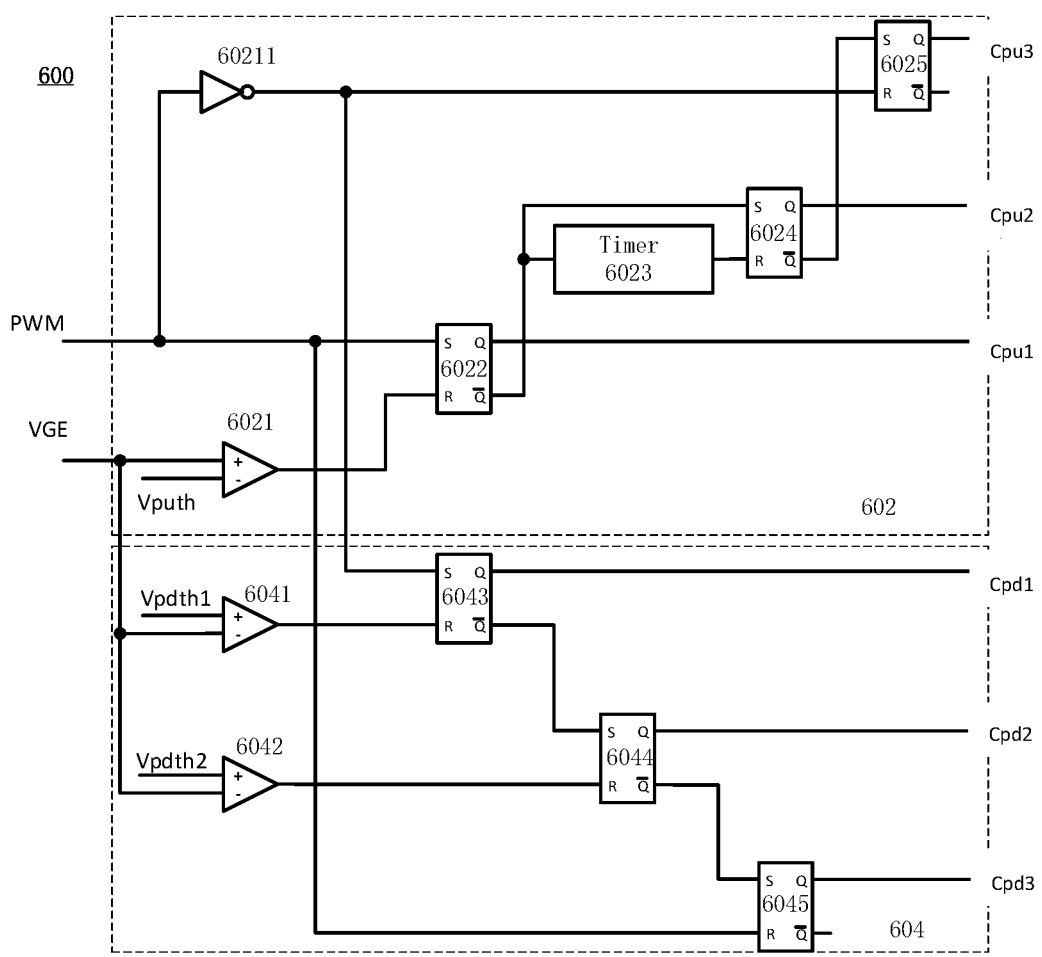
FIG. 6 is a schematic circuit diagram of a driving device according to an embodiment of the present application.
Figure 7A:
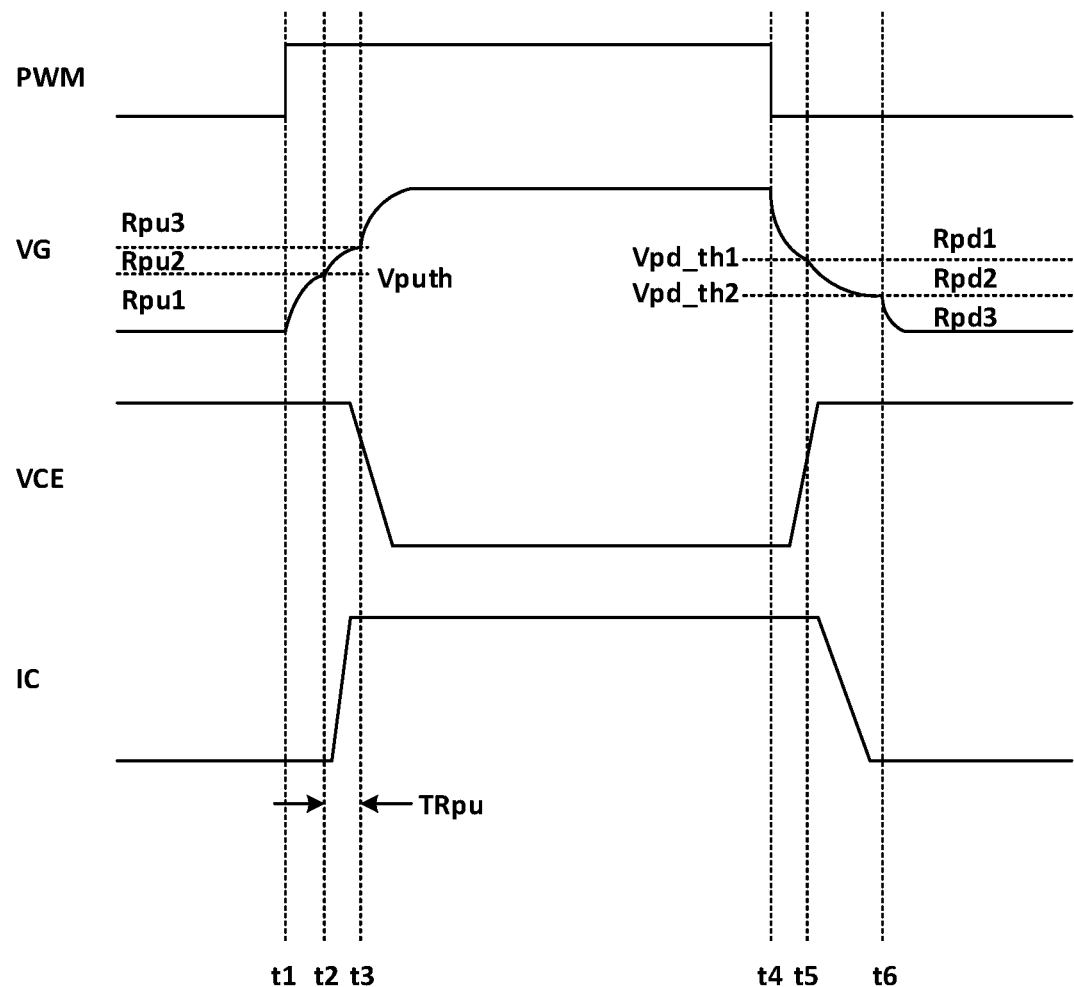
FIGS. 7A and 7B are schematic timing diagrams suitable for the circuit in FIG. 6.
Figure 7B:
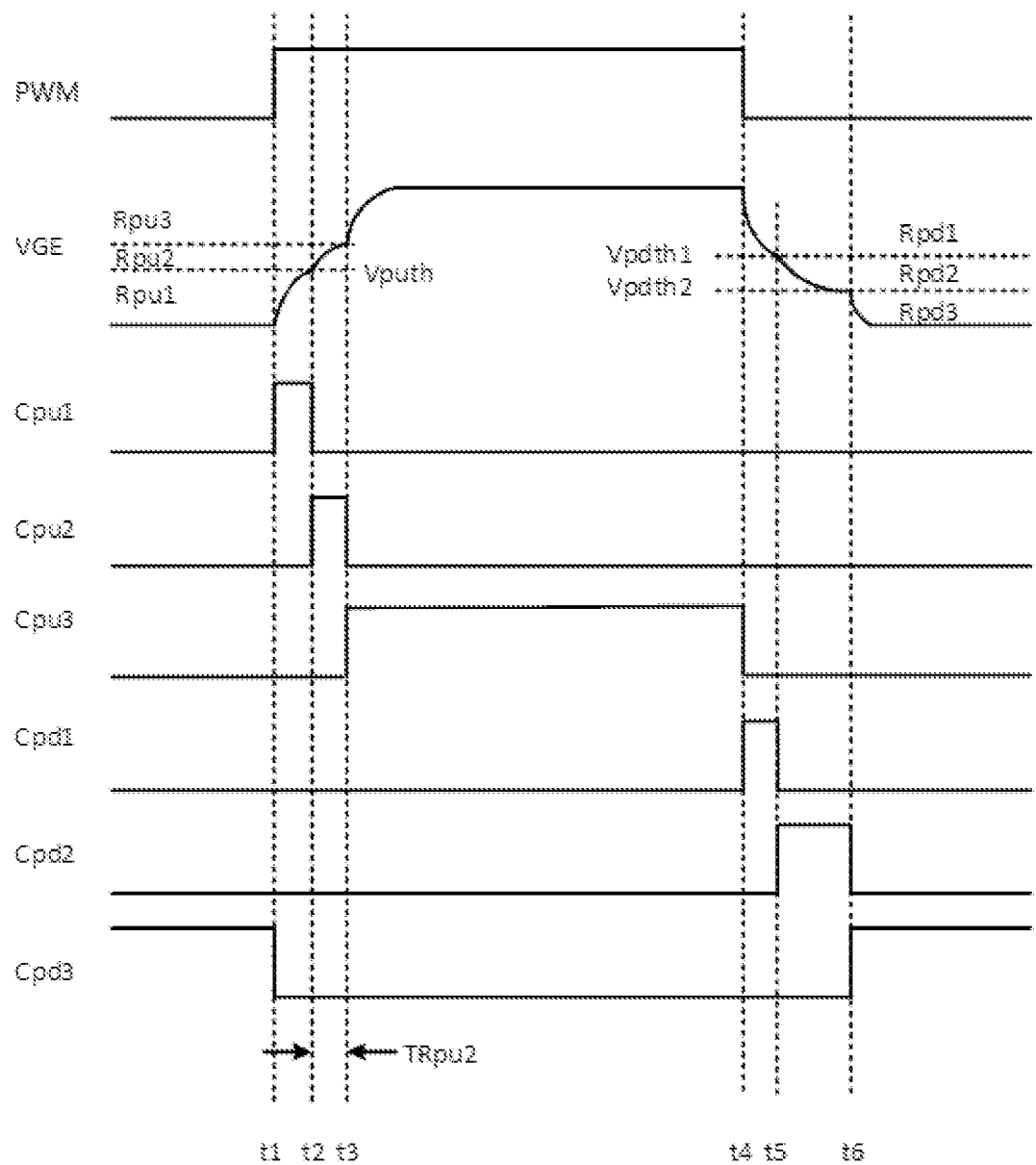

FIG. 6 shows a schematic circuit diagram of a power device multi-stage driving device according to an embodiment of the present application. FIGS. 7A and 7B are timing diagrams of the driving device according to FIG. 6.

As shown in FIG. 6, the driving device 600 may include a pull-up control circuitry 602 and a pull-down control circuitry 604.

According to one embodiment, the pull-up control circuitry 602 may include a comparator 6021 whose positive input terminal may be configured to receive the status signal of the power device such as VGE, and whose negative input terminal may be configured to receive the pull-up threshold voltage Vputh. The pull-up control circuitry 602 may further include an RS flip-flop 6022, its S input may be configured to receive the system switching signal PWM, its R input may be coupled to the output of the comparator 60211, and its Q output to the RS flip-flop 6024. The S terminal is configured to output the pull-up strength control signal Cpu1.

According to an embodiment, the pull-up control circuitry 602 may further include a timer 6023 whose control terminal is coupled to the $\overline{Q}$ output terminal of the RS flip-flop, and whose output terminal is coupled to the R terminal of the RS flip-flop 6024.

According to an embodiment, the $\overline{Q}$ output terminal of the RS flip-flop 6024 is coupled to the S terminal of the RS flip-flop 6025, and its Q output terminal is configured to output the pull-up strength control signal Cpu2.

According to one embodiment, the R terminal of the RS flip-flop 6025 is configured to receive the inverse signal of the system switching signal PWM, and its Q output terminal is configured to output the pull-up strength control signal Cpu3.

According to an embodiment, the pull-down control circuitry 604 may include a comparator 6041 whose positive input terminal may be configured to receive a pull-down threshold voltage Vpdth1, and the negative input terminal may be configured to receive a power device status signal VGE. The comparator 6042 is included, and its positive input terminal can be configured to receive the pull-down threshold voltage Vpdth2, and the negative input terminal can be configured to receive the power device status signal VGE; where Vpdth1 can be greater than Vpdth2.

According to an embodiment, the pull-down control circuitry 604 may further include an RS flip-flop 6043 whose S terminal is configured to receive the inverse signal of the system switching signal PWM, whose R terminal is coupled to the output terminal of the comparator 6041, and its Q output terminal It is configured to output the pull-down strength control signal Cpd1.

According to an embodiment, the pull-down control circuitry 604 may further include an RS flip-flop 6044, whose S terminal is coupled to the $\overline{Q}$ output terminal of the RS flip-flop 6043, whose R terminal is coupled to the output terminal of the comparator 6042, and whose Q output terminal is configured To output the pull-down strength control signal Cpd2.

According to an embodiment, the pull-down control circuitry 604 may further include an RS flip-flop 6045 whose S terminal is coupled to the $\overline{Q}$ output terminal of the RS flip-flop 6044, and whose Q output terminal is configured to output the pull-down strength control signal Cpd3.

According to an embodiment, the circuit structure used for the pull-down can also be used for the pull-up of the power device, that is to say, the pull-up control circuitry can also use multiple thresholds to implement the multi-stage driving.

As shown in FIGS. 7A and 7B, in this embodiment, during the turn on process the power device can be divided into three stages, each stage using a different pull-up strength, respectively using pull-up impedance Rpu1, Rpu2, Rpu3.

The First Pull-Up Stage: Time t1-t2

At this stage, the PWM signal jumps to a high level to start turning on the power device, at this time VCE is at a high potential, the current IC of the power device is zero, VG starts to rise but VG is always less than Vputh in this stage. As shown in FIG. 7B, the pull-up strength control signal Cpu1 is at a high level at this stage, and accordingly the pull-up impedance Rpu1 is used to pull up the control electrode potential VG of the power device. At this stage, PWM is high, VG is always less than Vputh, so the input of the S terminal of the flip-flop 6022 is high, the input of the R terminal is low, and the signal output from the Q terminal of the flip-flop 6022, that is Cpu1, is high level. Correspondingly, the other pull-up strength signals are at a low level.

The Second Pull-Up Stage: t2-t3

At this stage, VG rises to be greater than or equal to the threshold voltage Vputh, the R terminal input of the flip-flop 6022 is high level, so its Q terminal output signal, Cpu1, jumps to low level, and its $\overline{Q}$ terminal output signal jumps to high level. Therefore, the signal received at the S input of the flip-flop 6024 at this stage is at a high level, so the pull-up strength control signal Cpu2 jumps to a high level, and the corresponding resistance Rpu2 is selected to drive the power device. At this stage, VCE starts to fall from a high potential, and the current IC of the power device starts to rise.

According to an embodiment, when the Q terminal output signal of the flip-flop 6022 jumps to a low level, the timer 6023 starts counting.

The Third Pull-Up Stage: t3-t4

At this stage, the timer 6023 ends, and its output jumps from low to high, so the input of the R terminal of the flip-flop 6024 is high, and the output signal of the Q terminal of the flip-flop 6024 is pulled up. The control signal Cpu2 jumps to a low level, and its $\overline{Q}$ output signal jumps to a high level. At this time, the signal received by the S terminal of the flip-flop 6025 is high, and the signal received by the R terminal (the inverting of PWM) is low, so the output signal of the Q terminal of the flip-flop 6025, that is Cpu3, jumps to high level, selecting the impedance Rpu3 to drive the power device.

According to one embodiment, the driving device may keep the control electrode potential of the power element pulled up to a high potential using the impedance Rpu3, and continue until the shutdown signal of the power device is received, that is, the falling edge of the PWM signal. At this stage, VCE is at a low potential, and the current IC of the power device continues to output at the rated current value.

According to an embodiment, it is also possible to use two voltage thresholds, for example, to pull up the power device in three stages, that is, use two comparators to compare, for example, VGE with the first and second thresholds and compare and select different drive impedances based on the results of the comparison.

However, in the turn on process of the power device, the difference between the two threshold voltages is not very large. The method of using multiple thresholds for multi-stage drives, if the detection of the VGE value is not accurate enough, may lead to the failure to switch the driving impedance in time. Therefore, the actual use of the timer to determine the switching drive impedance is based on empirical judgment that VGE should have reached a level greater than or equal to the second threshold within the period of time or the end of the timer. Therefore, in this way, repeated detection is omitted, and the goal of multi-stage driving can be achieved more efficiently.

As shown in FIGS. 7A and 7B, in this embodiment, the power device shutdown process can also be divided into three stages, each stage uses a different pull-down strength, respectively using pull-up impedance Rpd1, Rpd2, Rpd3.

The First Pull-Down Stage: t4-t5

At this stage, the drive device receives the shutdown signal (i.e., the falling edge of the PWM signal), then stops using the pull-up impedance Rpu3 as the drive impedance, and starts to use the pull-down impedance Rpd1 to control the potential of the power element Pull down, so that VG begins to fall.

At this stage, although VG starts to fall, it is always higher than the preset threshold Vpdth1, so the output signal of the comparator 6041 is low level, so the input of the R terminal of the flip-flop 6043 is low level. In addition, because the PWM signal is at a low potential, the signal input to the S terminal of the flip-flop 6043 (the inverse signal of PWM) is high, so the signal Cpd1 output from its Q terminal is high, and the outputs of the other flip-flops are low Level.

Second Pull-Down Stage: t5-t6

At this stage, when VG drops to less than or equal to the preset threshold Vpdth1, the output signal of the comparator 6041 jumps to a high level, the R terminal input of the flip-flop 6043 is a high level, so its Q terminal output, the signal Cpd1, jumps to a low level, and the $\overline{Q}$ output signal at its end jumps to a high level, which means that the signal received at the S terminal of the flip-flop 6044 is at a high level.

At this stage, VG is always greater than Vpdth2, so the output of the comparator 6042 is low, that is, the signal received by the R terminal of the flip-flop 6044 is low. Therefore, the Q output signal of the flip-flop 6044, that is Cpd2, is high. The pull-down impedance Rpd2 is selected accordingly to pull down the potential of the control electrode of the power device.

Third Pull-Down Stage: After t6

At this stage, when VG continues to fall to less than or equal to the preset threshold Vpdth2, the output of the comparator 6042 jumps to a high level, so the signal received at the R terminal of the flip-flop 6044 is a high level, so the output signal of the Q terminal of the flip-flop 6044, that is Cpd2, jumps to a low level, and the $\overline{Q}$ output signal of its flip-flop jumps to a high level, that is to say, the signal received by the S terminal of the flip-flop 6045 at this time is a high level. The R terminal of the flip-flop 6045 is configured to receive the PWM signal, so what it receives at this stage is also low. Therefore, the Q terminal output signal Cpd3 of the flip-flop 6045 is at a high level, and the impedance Rpd3 is selected as the driving impedance.

It can be known from the above that the switching points of the pull-up driving strength and pull-down driving strength control signals can be customized by the value of each threshold voltage based in the needs of the applications, and/or the delay time from the timer. According to one embodiment, the relationship between the thresholds may be an equal difference, equal ratio, or power relationship.

Figure 8:
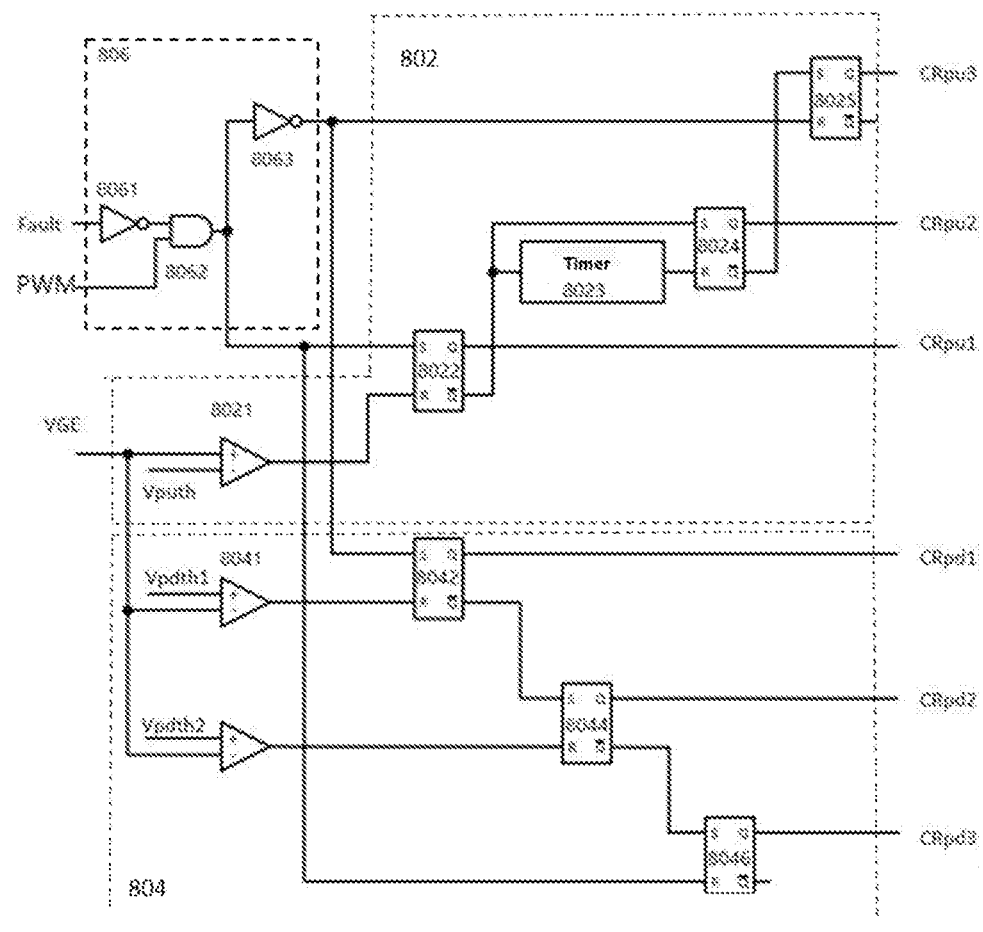
FIG. 8 is a schematic circuit diagram of a driving device according to another embodiment of the present application.

FIG. 8 is a schematic circuit diagram of a driving device according to another embodiment of the present application. Most of the components and connections are similar to those in FIG. 6, with the addition of the fault signal Fault on the power device on the drive.

Components in FIG. 8 that are similar to the reference numerals in FIG. 6 are the same as the corresponding structures in FIG. 6 and are not repeated here.

The added portion in FIG. 8 is the input signal strobe unit 806, which is configured to receive the system switching signal PWM, and the error signal Fault, and provide an input signal to the pull-up or pull-down control circuitry. When the error signal is low, the circuit in FIG. 8 works in exactly the same way as the circuit in FIG. 6. However, when the error signal Fault is at a high level, regardless of whether the system switching signal PWM is at a high level, and regardless of whether the power device is in a pull-up state or a stable conduction working state, the power device is immediately pulled down. If the power device is already in the pull-down or off state, the high level of the error signal Fault will not affect the existing pull-down or off state.

According to one embodiment, the input selection unit 806 may include a NOT gate 8061 configured to receive an error signal Fault, the output of which is coupled to an input of an AND gate 8062. The other input terminal of the AND gate 8062 is configured to receive the system switching signal PWM, and its output terminal is coupled to the input terminal of the NOT gate 8063, and the S terminal of the RS flip-flop 8022 and the R terminal of the RS flip-flop 8046. The output of NOT gate 8063 is coupled to the R terminal of RS flip-flop 8025 and the S terminal of RS flip-flop 8042.

Figure 9:
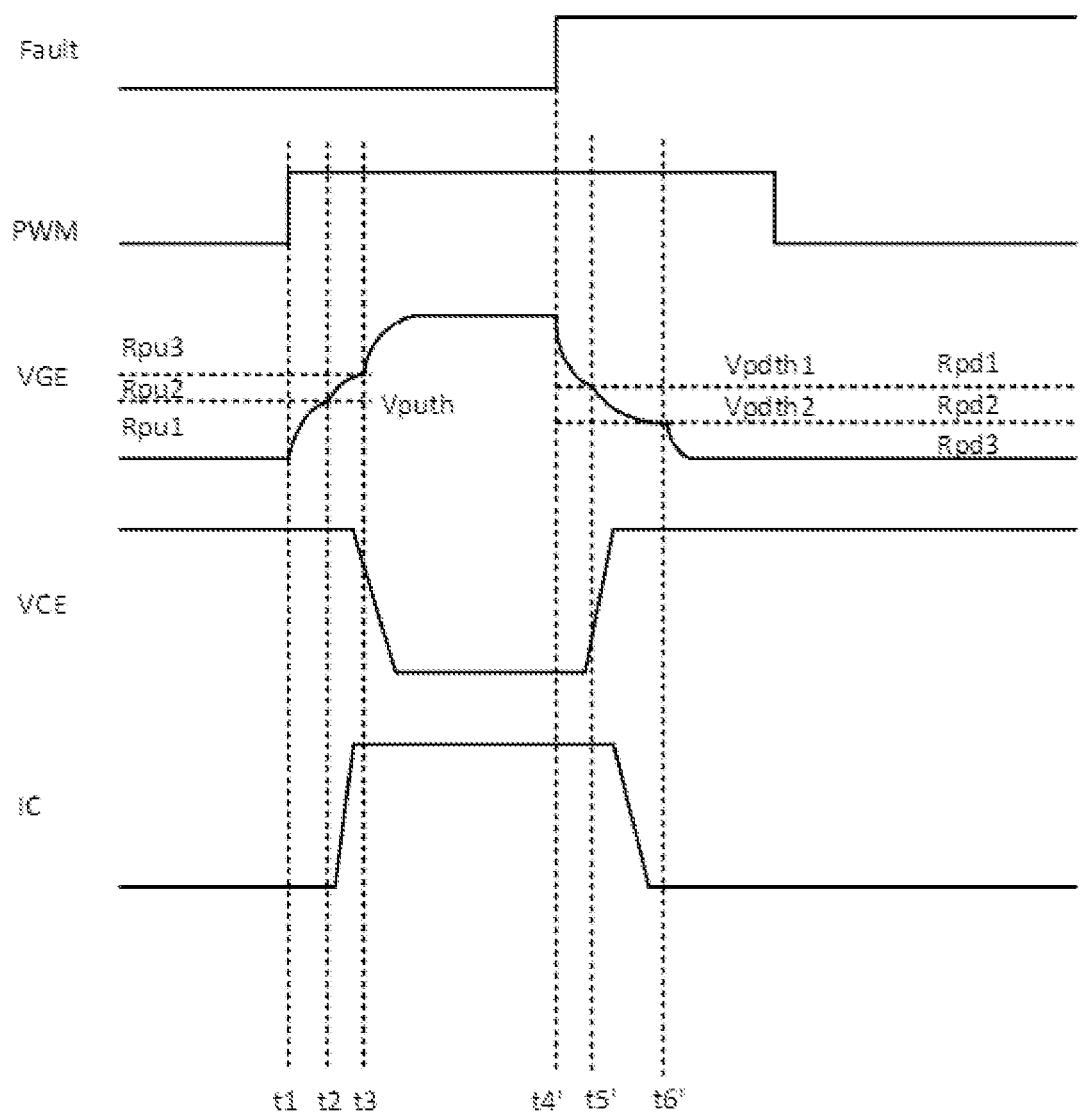
FIG. 9 is a schematic timing diagram applicable to the circuit in FIG. 8.

FIG. 9 is a working timing diagram of the circuit in FIG. 8. The pull-up part in this figure is the same as that in FIG. 7A, and will not be repeated here. According to one embodiment, after the power device is turned on, the error signal Fault jumps to a high level at time t4'. Although the PWM is still at a high level at this time, the power transistor is in a state of stable operation and conduction, the driving device will still start to perform pull-down driving on the power device. The specific operation in the pull-down process is the same as that shown in FIGS. 7A and 7B.

Figure 10A:
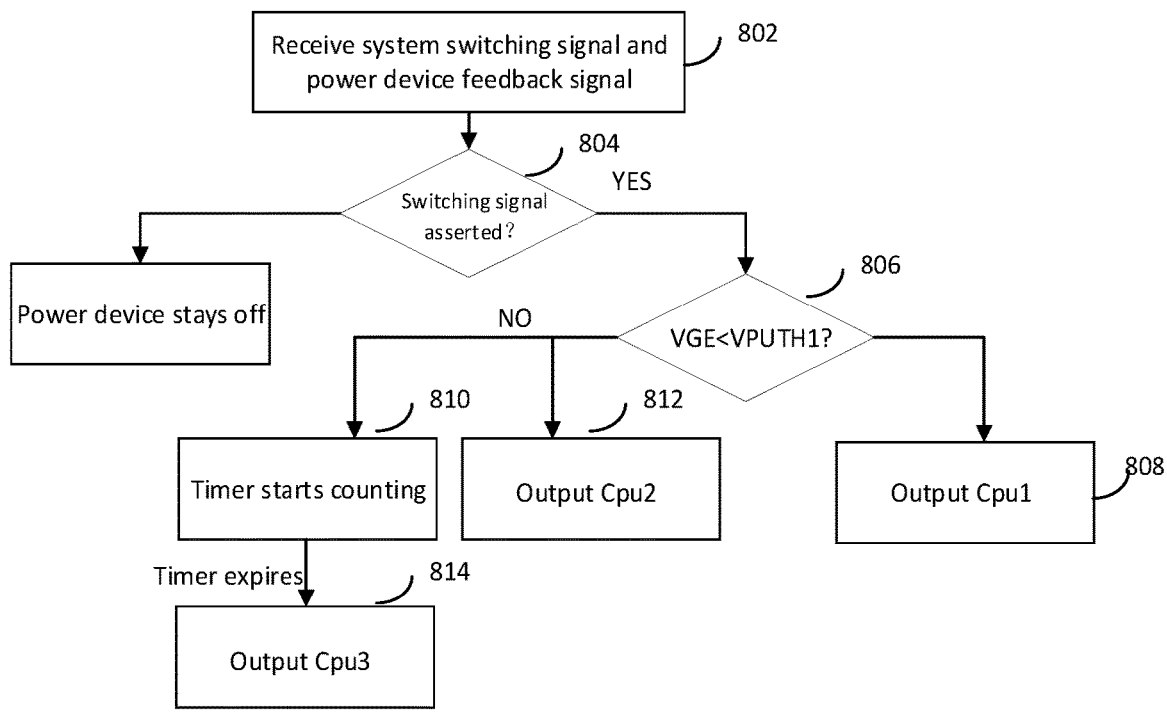
FIG. 10A is a schematic flowchart of a power device pull-up multi-stage driving method according to an embodiment of the present application.

FIG. 10A is a schematic flowchart of a power device pull-up driving method according to an embodiment of the present application.

In step 802, the system switching signal and the feedback signal of the power device may be received. For example, when the power device is an IGBT, the feedback signal may be VGE.

In step 804, it can be determined whether the system switch signal is asserted, if it is de-asserted, for example is still low, then the power device is kept in the off state.

If the system switching signal is asserted, for example, at a high level in step 806, it is determined whether the power device feedback signal is less than the first pull-up threshold Vputh.

If the power device feedback signal is less than the first pull-up threshold Vputh, in step 808 the first pull-up strength control signal Cpu1 is output, and Rpu1 is selected as the driving impedance according to a preset correspondence.

If the power device feedback signal is greater than or equal to the first pull-up threshold Vputh, in step 810 the second pull-up strength control signal Cpu2 is output, and Rpu2 is selected as the driving impedance according to a preset correspondence. Alternatively, at step 810 the timer can also be started.

At step 814, the timer expires, the third pull-up strength control signal Cpu3 is output, and Rpu3 is selected as the driving impedance according to the preset correspondence.

Figure 10B:
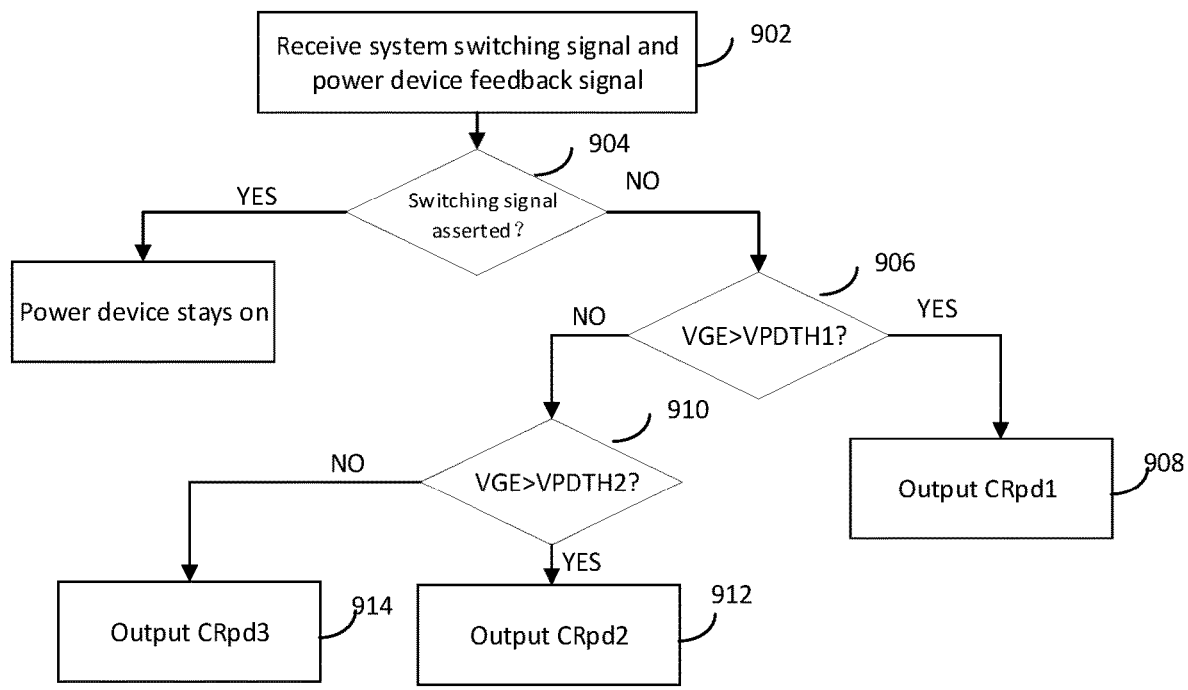
FIG. 10B is a schematic flowchart of a power device pull-down multi-stage driving method according to an embodiment of the present application.

FIG. 10B is a schematic flowchart of a pull-down driving method of a power device according to an embodiment of the present application.

In step 902, the system switching signal and the feedback signal of the power device may be received. For example, when the power device is an IGBT, the feedback signal may be VGE.

In step 904, it can be judged whether the system switching signal is valid, and if valid, for example still high level, the power device is kept in a conducting state.

If the system switch signal fails, for example at a low level, in step 906 it is determined whether the power device feedback signal is greater than the first pull-down threshold Vpdth1.

If the power device feedback signal is greater than the first pull-down threshold Vpdth1, in step 908 the first pull-down strength control signal Cpd1 is output, and Rpd1 is selected as the driving impedance according to a preset correspondence.

If the power device feedback signal is less than or equal to the first pull-down threshold Vpdth1, in step 910 it is determined whether the power device feedback signal is greater than the second pull-down threshold Vpdth2, where Vpdth2 is less than Vpdth1.

If the power device feedback signal is greater than the second pull-down threshold Vpdth2, then in step 912 a second pull-down strength control signal Cpd2 is output, and Rpd2 is selected as the driving impedance according to a preset correspondence.

If the power device feedback signal is less than or equal to the second pull-down threshold Vpdth2, then in step 914 the timing ends, the third pull-down strength control signal Cpd3 is output, and Rpd3 is selected as the driving impedance according to a preset correspondence.

According to an embodiment, when a valid error signal is received, regardless of whether the power device is in the pull-up or open phase, the pull-down operation is started. The specific steps are similar to those described in FIG. 10B and related content.

The present application also provides an electric appliance including the above power device driving device, which includes one or more power devices, the driving device as described above, coupled to the corresponding power device, the main control circuitry, and coupled with the isolation unit between the main control circuitry and the driving device. In this application, a larger impedance or driver array is integrated into the driver chip which can be packaged with a metal heat dissipation structure. Since the isolation unit is stripped from the driver chip, there is no conflict between the metal heat dissipation requirement and the isolation function, so the heat dissipation of the drive device of the power device is individually optimized.

Although the present application has been described with reference to specific examples, which are intended to be exemplary only, and not to limit the present application, it is obvious to those of ordinary skill in the art that the disclosed embodiments can be changed, added, or deleted based on the spirit and protection scope of the present application.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A power device driving device, comprising:
a control circuitry coupled to receive at least a system switching command and a feedback signal of a power device, and to generate one of a pull-up strength control signal or a pull-down strength control signal based on the received signals;

a pull-up array, coupled between the control circuitry and the power device, and configured to provide a pull-up signal with a pull-up strength for the power device based on the pull-up strength control signal; and a pull-down array, coupled between the control circuitry and the power device, and configured to provide a pull-down signal with a pull-down strength for the power device based on the pull-down strength control signal, wherein:

the control circuitry includes a pull-down control circuitry that includes a first comparison unit configured to compare the feedback signal of the power device with a first pull-down threshold and a second comparison unit configured to compare the feedback signal of the power device with a second pull-down threshold;

in response to the feedback signal is greater than the first pull-down threshold, the pull-down control circuitry is configured to generate a first pull-down strength control signal;

in response to the feedback signal is smaller than or equal to the first pull-down threshold and is greater than the second pull-down threshold, the pull-down control circuitry is configured to generate a second pull-down strength control signal; and in response to the feedback signal is smaller than or equal to the second pull-down threshold, the pull-down control circuitry is configured to generate a third pull-down strength control signal, the first pull-down strength control signal, the second pull-down strength control signal, and the third pull-down strength control signal being different from one another; and wherein:

the control circuitry includes a pull-up control circuitry that includes a third comparison unit configured to compare the feedback signal of the power device with a first pull-up threshold;

in response to the feedback signal is smaller than the first pull-up threshold, the pull-up control circuitry is configured to generate a first pull-up strength control signal; and in response to the feedback signal is greater than or equal to the first pull-up threshold, a timer starts, and the pull-up control circuitry is configured to generate a second pull-up strength control signal before the timer ends, and to generate a third pull-up strength control signal after the timer ends, the first pull-up strength control signal, the second pull-up strength control signal, and the third pull-up strength control signal being different from one another.

2. The driving device according to claim 1, further comprising:

a decoding unit, coupled between the control circuitry and the pull-up and the pull-down array, configured to generate corresponding pull-up or pull-down control signals based on the pull-up or pull-down strength control signals, wherein each of the pull-up array and the pull-down array includes multiple resistive elements and the pull-up or pull-down control signals indicate which one or more resistive elements of the multiple resistive elements in the pull-up array or the pull-down array is engaged in driving the power device.

3. The driving device according to claim 1, wherein:

the pull-up control circuitry further includes a delay unit configured to start the timer in response to the power device feedback signal is greater than or equal to the first pull-up threshold, and at an end of the timer, the pull-up control circuitry is configured to switch the pull-up strength control signal to the third pull-up strength control signal in response to, during or at the end of the timer, the feedback signal of the power device reaching a second pull-up threshold that is greater than the first pull-up threshold; and the pull-down control circuitry further includes a delay unit configured to start a timer in response to the power device feedback signal is smaller than or equal to the first pull-down threshold, and at an end of the timer, the pull-down control circuitry is configured to switch the pull-down strength control signal to the third pull-down strength control in response to the power device feedback signal is smaller than or equal to the second pull-down threshold that is smaller than the first pull-down threshold.

4. The driving device according to claim 1, wherein the control circuitry is further configured to receive an error signal of the power device, and in response to the error signal being asserted, the control circuitry is configured to output the pull-down strength control signal.

5. The driving device according to claim 4, wherein the error signal includes one or more of an overcurrent signal, an over temperature error signal, or other power supply fault signal of the power device.

6. The driving device according to claim 1, wherein the power device is an IGBT transistor, and the feedback signal is a voltage between a gate and an emitter of the IGBT transistor.

7. The driving device according to claim 1, wherein each of the pull-up or pull-down array includes a plurality of resistive elements arranged in parallel to one another, the impedances of the plurality of elements having one of an equal difference, an equal ratio, or a power relationship.

8. The driving device of claim 7, wherein a resistive element of the plurality of resistive elements is a transistor, which is coupled to a supply potential and an output terminal of the driving device, a control terminal of the transistor is configured to receive a pull-up or pull-down control signal, and a control electrode of the transistor is coupled to a corresponding driver.

9. The driving device according to claim 1, wherein the one or more pull-up or pull-down thresholds includes a plurality of thresholds with an equal difference, equal ratio or power relationship among the plurality of thresholds.

10. An electric device comprising one or more power devices and a driving device, the driving device including:

a control circuitry coupled to receive at least a system switching command and a feedback signal of a power device and to generate one of a pull-up strength control signal or a pull-down strength control signal based on the received signals;

a pull-up array, coupled between the control circuitry and the power device, configured to provide a pull-up signal with a pull-up strength for the power device based on the pull-up strength control signal; and a pull-down array, coupled between the control circuitry and the power device, configured to provide a pull-down signal with a pull-down strength for the power device based on the pull-down strength control signal, wherein:
the control circuitry includes a pull-down control circuitry that includes a first comparison unit configured to compare the feedback signal of the power device with a first pull-down threshold and a second comparison unit configured to compare the feedback signal of the power device with a second pull-down threshold that is smaller than the first pull-down threshold;
in response to the feedback signal is greater than the first pull-down threshold, the pull-down control circuitry is configured to generate a first pull-down strength control signal; and
in response to the feedback signal is smaller than or equal to the first pull-down threshold, a timer starts, and the pull-down control circuitry is configured to generate a second pull-down strength control signal before the timer ends, and generate a third pull-up strength control signal after the timer ends and in response to that during or at an end of the timer, the feedback signal is smaller than or equal to the second pull-down threshold.

11. A power device driving method, comprising driving a power device in multiples stages based on a switching command and a feedback signal of the power device, including:
receiving the switching command and the feedback signal;
determining from the switching command whether a system switch command is asserted;
in response to determining that a system switch command is asserted;
comparing the feedback signal with a first pull-up threshold;
in response to the feedback signal is smaller than the first pull-up threshold, generating a first pull-up strength control signal; and
in response to the feedback signal is greater than or equal to the first pull-up threshold, starting a timer, generating a second pull-up strength control signal before the timer ends, and generating a third pull-up strength control signal after the timer ends, the first pull-up strength control signal, the second pull-up strength control signal, and the third pull-up strength control signal being different from one another; and
in response to determining that the system switch signal is de-asserted,
comparing the feedback signal of the power device with a first pull-down threshold and a second pull-down threshold;
in response to the feedback signal is greater than the first pull-down threshold, generating a first pull-down strength control signal;
in response to the feedback signal is smaller than or equal to the first pull-down threshold and is greater than the second pull-down threshold, generating a second pull-down strength control signal; and
in response to the feedback signal is smaller than or equal to the second pull-down threshold, generating a third pull-down strength control signal, the first pull-down strength control signal, the second pull-down strength control signal and the third pull-down strength control signal being different from one another.

12. The method of claim 11, further comprising:
in response to the feedback signal being greater than or equal to a second pull-up threshold, generating the third pull-up strength control signal, the second pull-up threshold being greater than the first pull-up threshold.

13. The method of claim 11, wherein the generating the third pull-up strength control signal after the timer ends includes:
at an end of the timer, in response to the feedback signal reaching a second pull-up threshold during or at the end of the timer, generating the third pull-up strength control signal, the second pull-up threshold being greater than the first pull-up threshold.

14. The method of claim 11, further comprising:
in response to the feedback signal being less than or equal to the first pull-down threshold, starting a timer; and
at an end of timer, in response to the feedback signal being smaller than or equal to the second pull-down threshold during or at the end of the timer, generating the third pull-down strength control signal, the first pull-down threshold being greater than the second pull-down threshold.

15. The method of claim 11, wherein the pull-up strength control signal and the pull-down strength control signal each provides a different pull-up or pull-down impedance to drive the power device.

16. The method of claim 11, wherein the pull-up strength control signal and the pull-down strength control signal each corresponds to a different set of pull-up or pull-down resistive elements to drive the power device.

17. The electric device according to claim 10, wherein the driving device includes:
a decoding unit, coupled between the control circuitry and the pull-up and the pull-down array, configured to generate corresponding pull-up or pull-down control signals based on the pull-up or pull-down strength control signals,
wherein each of the pull-up array and the pull-down array includes multiple resistive elements and the pull-up or pull-down control signals indicate which one or more resistive elements of the multiple resistive elements in the pull-up array or the pull-down array is engaged in driving the power device.

18. The electric device according to claim 10, wherein the control circuitry is further configured to receive an error signal of the power device, and in response to the error signal being asserted, the control circuitry is configured to output a pull-down strength control signal.

19. The electric device according to claim 18, wherein the error signal includes one or more of an overcurrent signal, an over temperature error signal, or other power supply fault signal of the power device.

20. The electric device according to claim 10, wherein each of the pull-up or pull-down array includes a plurality of resistive elements arranged in parallel to one another, the impedances of the plurality of elements having one of an equal difference, an equal ratio, or a power relationship.

* * * * *